United States Patent [19]

Mallecot et al.

[11] Patent Number: 5,616,522
[45] Date of Patent: Apr. 1, 1997

[54] METHOD OF MAKING A MARK ON A WAFER SUCH AS A SEMICONDUCTOR WAFER INCORPORATING A BURIED STRUCTURE

[75] Inventors: Franck Mallecot, Montrouge; Claude Artigue, Bourg la Reine; Denis LeClerc, Igny; Lionel Legouezigou, Le Val St Germain; Francis Poingt, Ste Genevieve des-Bois; Frédéric Pommereau, Bretigny sur Orge, all of France

[73] Assignee: Alcatel N.V., Rijiswijk, Netherlands

[21] Appl. No.: 518,274

[22] Filed: Aug. 23, 1995

[30] Foreign Application Priority Data

Aug. 26, 1994 [FR] France .................... 94 10326

[51] Int. Cl.$^6$ .................................................. H01L 21/027
[52] U.S. Cl. .......................... 438/42; 438/44; 438/975; 438/702
[58] Field of Search .......................... 437/228; 156/625.1

[56] References Cited

U.S. PATENT DOCUMENTS 4,563,765  1/1986  Tsang et al. ........................... 372/50
5,157,003  10/1992  Tsuji et al. ............................ 437/229

FOREIGN PATENT DOCUMENTS

0455090A1  11/1991  European Pat. Off. .
0541820    5/1993   European Pat. Off. .
0564191A2  10/1993  European Pat. Off. .

OTHER PUBLICATIONS

Patent Abstracts Of Japan, vol. 010, No. 279 (E–439), 20 Sep. 1986 & JP-A-61 100928 (Mitsubishi Electric Corp) 19 May 1986.

Patent Abstracts Of Japan, vol. 018, N. 478 (P–1796), 6 Sep. 1994 & JP-A-06 160656 (NGK Insulators Ltd) 7 Jun. 1994.

*Primary Examiner*—R. Bruce Breneman
*Assistant Examiner*—R. Paladugu
*Attorney, Agent, or Firm*—Sughrue, Mion, Zinn, Macpeak & Seas

[57] ABSTRACT

For end-to-end alignment of two optical waveguides one of which is in the form of a strip buried in a semiconductor wafer, a longitudinal lateral mark is used constituted by the flank of a valley etched in the wafer and self-aligned to the strip formed beforehand. To achieve this self-alignment a protection layer is deposited in the area in which the mark is to be formed, a register layer is deposited on top of the protection layer and a photosensitive resin is deposited on top of these layers and the substrate. First selective etching eliminates the register layer at the location of the valley of the mark. Second and third selective etching respectively etch the lateral channels of the strip and then the valley of the mark.

2 Claims, 1 Drawing Sheet

METHOD OF MAKING A MARK ON A WAFER SUCH AS A SEMICONDUCTOR WAFER INCORPORATING A BURIED STRUCTURE

BACKGROUND OF THE INVENTION

1. Field of the Invention

The present invention concerns the precise end-to-end alignment of two optical waveguides formed independently and one of which is buried in a wafer such as a semiconductor wafer. A longitudinal lateral mark usually called the "hybridation mark" is used for this purpose.

2. Description of the Prior Art

The optical waveguides are of strip form and are referred to hereinafter as "optical strips". The problem of aligning them arises in particular when an amplifier waveguide has to be connected to an optical waveguide. The mark is usually a rectilinear flank recessed into the wafer. Its height is often different than that of the optical strip.

If two strips to be aligned are on the surface of a wafer (these are called "external" strips), the positions of the lateral channels on either side of the strips and of the valley at one lateral extremity defining the mark are etched into the same protective layer. Chemical etching or particle beam etching is then employed to recess the lateral channels of the strips and, to a very partial extent, the valley of the mark. The lateral channels and the strip are then protected, after which etching of the valley of the mark is completed.

Transposing this method to aligning a buried strip, the formation of which requires further epitaxial growth, is ruled out by the fact that the protection of the lateral channels of the optical strips degrades the wall of these channels which must be of good crystallographic quality at a later stage to constitute an interface for further epitaxial growth. It is impossible to restore this surface in the case of a laser strip element amplifier junction because the optical strips must have a narrow square cross-section. This cross-section must be formed between deep channels which rules out restoration to modify the shape of their cross-section.

Until now, the alignment mark for aligning a buried strip in a monocrystalline semiconductor wafer has been formed in a crystal plane. However, this method cannot be used in the case of hybridation in silicon Vees of strip semiconductor amplifiers inclined to the cleaved faces. In this case the alignment marks must be inclined to the cleaved faces.

The general object of the present invention is to obtain precise relative transverse positioning of two components that have to be etched independently, such as the flanks of an optical strip to be buried and an alignment mark, without crystallographic constraints, and in particular in such manner as to allow subsequent accurate end-to-end alignment of two optical strips one of which is buried.

SUMMARY OF THE INVENTION

To this end, the present invention consists in a method of making an etched mark on a wafer such as a semiconductor wafer including a buried flank, said mark having the shape of an etched flank and defining the transverse position of at least one other etched flank formed in said wafer and constituting said buried flank, said mark and said buried flank being respectively formed within a mark area and an area to be buried and respectively comprising the edges of a mark recess and a recess to be buried etched in said area, in which method a) a protection layer is deposited in said mark area and a register layer is deposited on said protection layer, these two layers being of different composition, b) a photosensitive resin is deposited on said register layer and on said area to be buried, c) said photosensitive resin is eliminated photolithographically in the areas of said mark recess and said recess to be buried to define future positions of said mark and said flank to be buried, d) said wafer is etched to eliminate the part of said register layer that is not protected by said photosensitive resin, this etch sparing said resin, said protection layer and the material of said wafer, the position of said mark being then defined by an edge of said register layer, e) said wafer is etched to recess said flank to be buried, this etch sparing said photosensitive resin, said protection layer and said register layer, f) said photosensitive resin is eliminated, g) a burying material such as a semiconductor material is deposited, for example grown epitaxially, to bury said flank to be buried, h) said material of said wafer is protected in said area to be buried, and i) said wafer is etched to eliminate the part of said protection layer that is not protected by said register layer, this etch sparing said register layer and said protected material of said wafer and etching the material of said wafer that is not protected to form said mark recess.

In a typical case said two flanks to be buried are constituted by two edges of an optical strip to be buried and said two recesses to be buried are constituted by two channels on either side of said strip.

The production of a longitudinal alignment mark (or "hybridation mark") for an optical strip, which can be a usual type optical strip or a laser strip amplifying the signal from the first optical strip, is described hereinafter, by way of example and with reference to the appended drawings.

DETAILED DESCRIPTION OF THE PREFERRED EMBODIMENT

Figure 1:
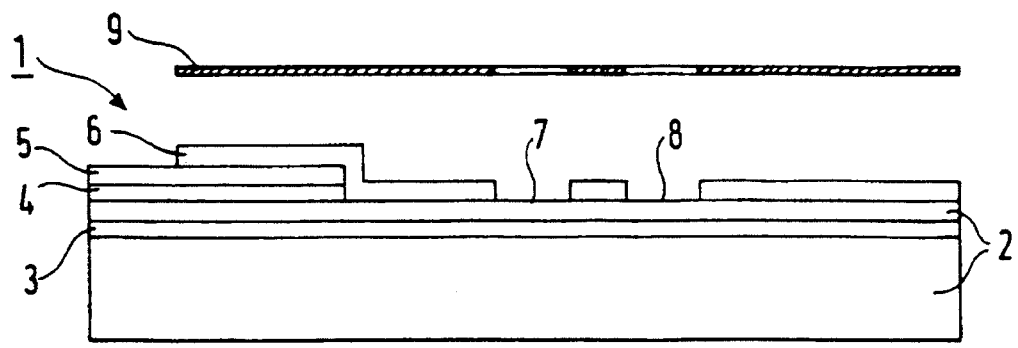
FIG. 1 shows a photolithography operation exposing simultaneously the locations of the lateral channels on either side of the optical strip and the valley of the alignment mark.

At the beginning of the operation to define the mark in an area 1 (on the lefthand side in the figure) on top of a wafer 2, for example an indium phosphate wafer, in which the optical layer 3 is formed, a protection layer 4 with a register layer 5 on top of it is deposited in the area 1. The chemical natures of the layers 4 and 5 are different, one being silicon nitride and the other silicon oxide, for example. These layers and the substrate are covered with a layer of photosensitive resin 6.

By photolithography using a mask 9, the locations of the lateral channels 7, 8 of the optical strip and that of the valley of the marker are exposed at the same time (FIG. 1).

Figure 2:
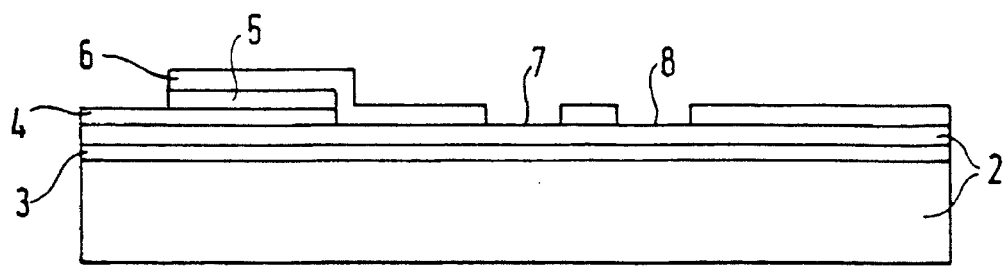
FIG. 2 shows an operation of selective etching through a photosensitive resin eliminating a register layer at the location of the valley of the mark.

A first selective etching operation is carried out via the openings in the photosensitive resin. It eliminates the register layer 5 at the location of the valley of the mark without etching the substrate (FIG. 2).

Figure 3:
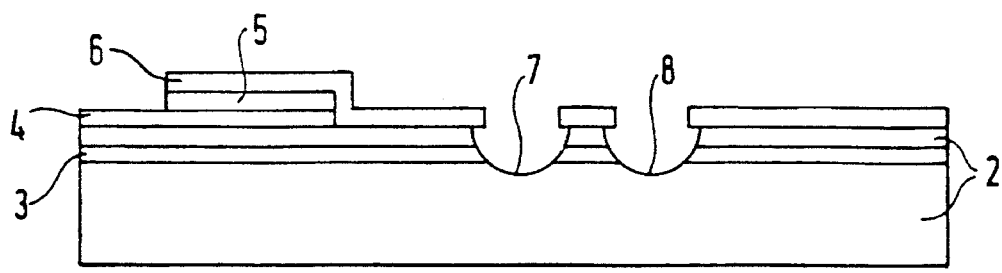
FIG. 3 shows a subsequent selective etching operation through the photosensitive resin to recess the lateral channels of the strip without etching the protection layer or the register layer.

A second selective etching operation via the same openings recesses the lateral channels 7, 8 of the strip without etching the protection layer 4 or, laterally, the register layer 5 (FIG. 3).

The resin is eliminated and then the optical strip and the lateral channels are covered with a material such as the same material as the wafer.

Figure 4:
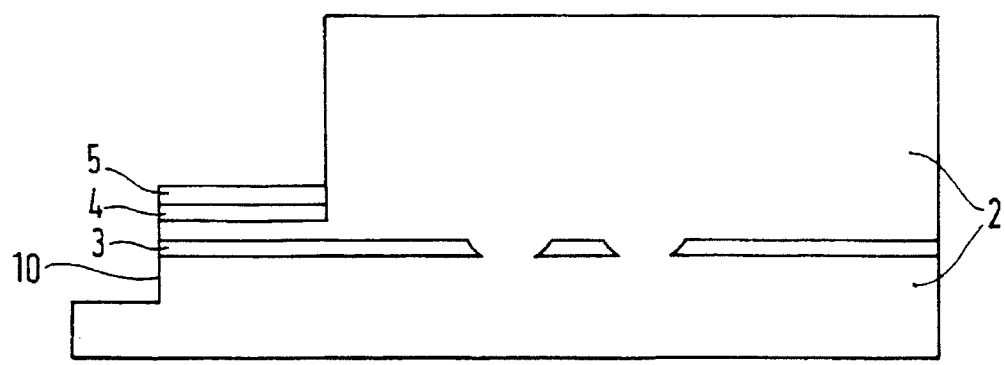
FIG. 4 shows the etching of the valley of the alignment marker.

In a subsequent operation the valley of the mark localized by the register layer 5 is selectively etched, only the protection layer 4 and part of the thickness of the wafer 2 being etched. This defines a vertical rectilinear flank 10 with great precision, ±0.3 micrometer or even better (FIG. 4). This flank enables excellent end-to-end alignment of the buried strip with another strip.

The selective etches to form the alignment marker and the lateral channels of the waveguide can be dry etches (particle beam etches) or wet etches (chemical etches). The alignment marks obtained can have any shape in plan view, inclined relative to the crystal axes of the substrate and located anywhere in the plane of further epitaxial growth.

There is claimed:

1. Method of making an etched mark on a wafer such as a semiconductor wafer including a buried flank, said mark having the shape of an etched flank and defining the transverse position of at least one other etched flank formed in said wafer and constituting said buried flank, said mark and said buried flank being respectively formed within a mark area and an area to be buried and respectively comprising the edges of a mark recess and a recess to be buried etched in said area, in which method a) a protection layer is deposited in said mark area and a register layer is deposited on said protection layer, these two layers being of different composition, b) a photosensitive resin is deposited on said register layer and on said area to be buried, c) said photosensitive resin is eliminated photolithographically in the areas of said mark recess and said recess to be buried to define future positions of said mark and said flank to be buried, d) said wafer is etched to eliminate the part of said register layer that is not protected by said photosensitive resin, this etch sparing said resin, said protection layer and the material of said wafer, the position of said mark being then defined by an edge of said register layer, e) said wafer is etched to recess said flank to be buried, this etch sparing said photosensitive resin, said protection layer and said register layer, f) said photosensitive resin is eliminated, g) a burying material such as a semiconductor material is deposited, for example grown epitaxially, to bury said flank to be buried, h) said material of said wafer is protected in said area to be buried, and i) said wafer is etched to eliminate the part of said protection layer that is not protected by said register layer, this etch sparing said register layer and said protected material of said wafer and etching the material of said wafer that is not protected to form said mark recess.

2. Method according to claim 1 wherein said two flanks to be buried are constituted by two edges of an optical strip to be buried and said two recesses to be buried are constituted by two channels on either side of said strip.

* * * * *